(12) United States Patent
Yoshida et al.

(10) Patent No.: US 8,855,163 B2
(45) Date of Patent: Oct. 7, 2014

(54) OPTICAL SEMICONDUCTOR DEVICE

(71) Applicant: Kabushiki Kaisha Toshiba, Minato-ku (JP)

(72) Inventors: Haruhiko Yoshida, Chiba (JP); Kazuya Ohira, Tokyo (JP); Mizunori Ezaki, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/132,170

(22) Filed: Dec. 18, 2013

(65) Prior Publication Data

US 2014/0185641 A1    Jul. 3, 2014

(30) Foreign Application Priority Data

Dec. 28, 2012  (JP) .................. 2012-288321

(51) Int. Cl.
  *H01S 5/00* (2006.01)
  *H01S 5/026* (2006.01)
(52) U.S. Cl.
  CPC ..................... *H01S 5/026* (2013.01)
  USPC ................................... 372/50.124
(58) Field of Classification Search
  CPC ............. H01S 5/00; H01S 5/10; H01S 5/026
  USPC ....................................... 372/50.1
  See application file for complete search history.

(56) References Cited

U.S. PATENT DOCUMENTS

2012/0153260 A1* 6/2012 Kim et al. ............. 257/14
2012/0250714 A1* 10/2012 Ohira et al. .......... 372/45.01

OTHER PUBLICATIONS

Joris Van Campenhout et al. "A Compact SOI-Integrated Multiwavelength Laser Source Based on Cascaded InP Microdisks", IEEE Photonics Technology Letters, vol. 20, No. 16, Aug. 15, 2008, 3 pages.

* cited by examiner

*Primary Examiner* — Tuan Nguyen
(74) *Attorney, Agent, or Firm* — Oblon, Spivak, McClelland, Maier & Neustadt, L.L.P.

(57) ABSTRACT

An optical semiconductor device of one embodiment includes: a first semiconductor layer of a first conductivity type; an active layer provided on the first semiconductor layer and has a ring- or disk-like shape; a second semiconductor layer of a second conductivity type that is provided on the active layer and has a ring- or disk-like shape; a first electrode provided on the first semiconductor layer; and a second electrode provided on the second semiconductor layer. The first semiconductor layer includes a first region having a ring- or disk-like shape, and a second region provided around the outer circumference of the first region and has a smaller thickness than the first region. The first electrode is provided on the second region, and a groove or holes are provided in a portion of the second region located between the first region and the first electrode.

8 Claims, 13 Drawing Sheets

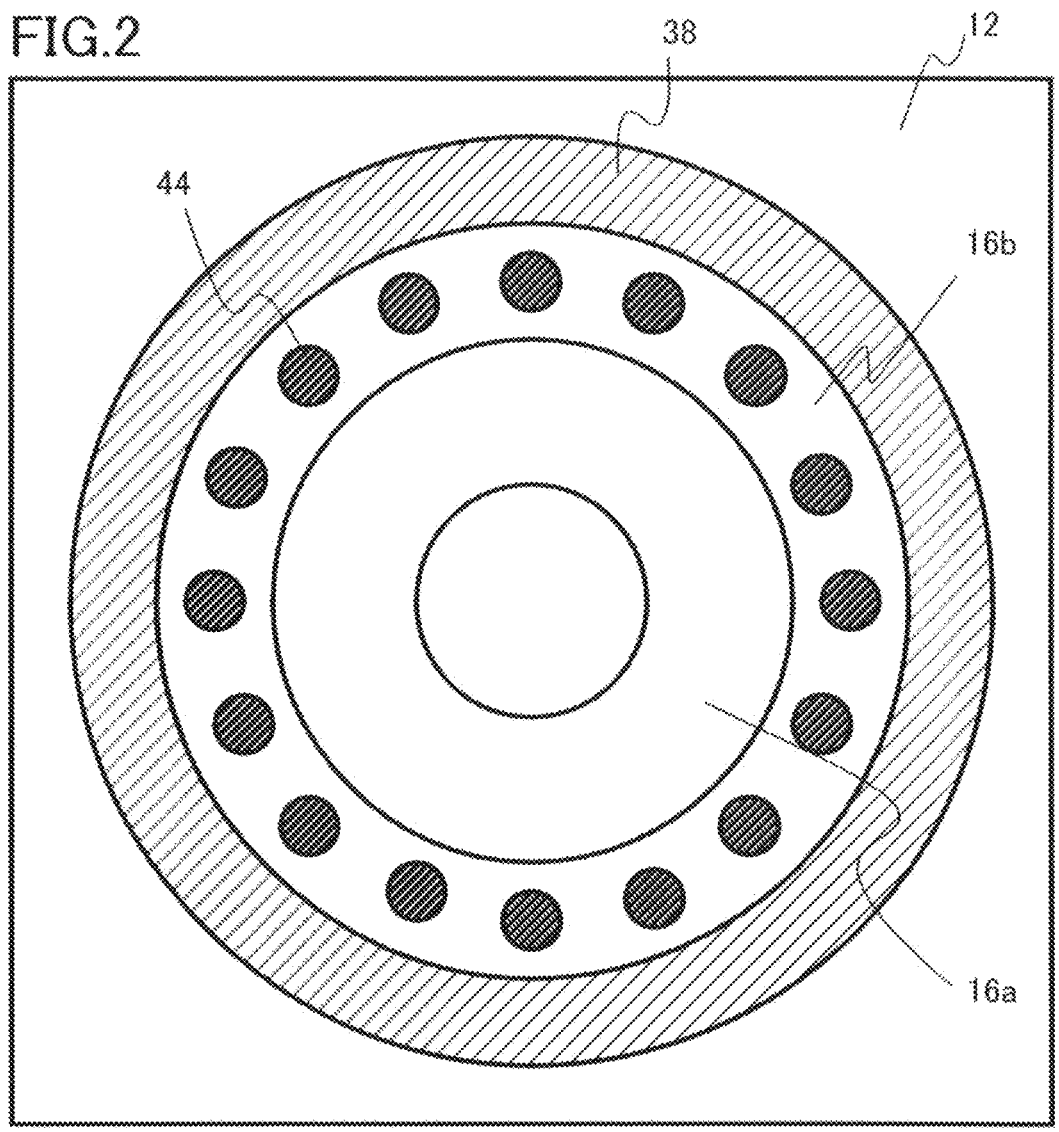

OPTICAL SIGNAL

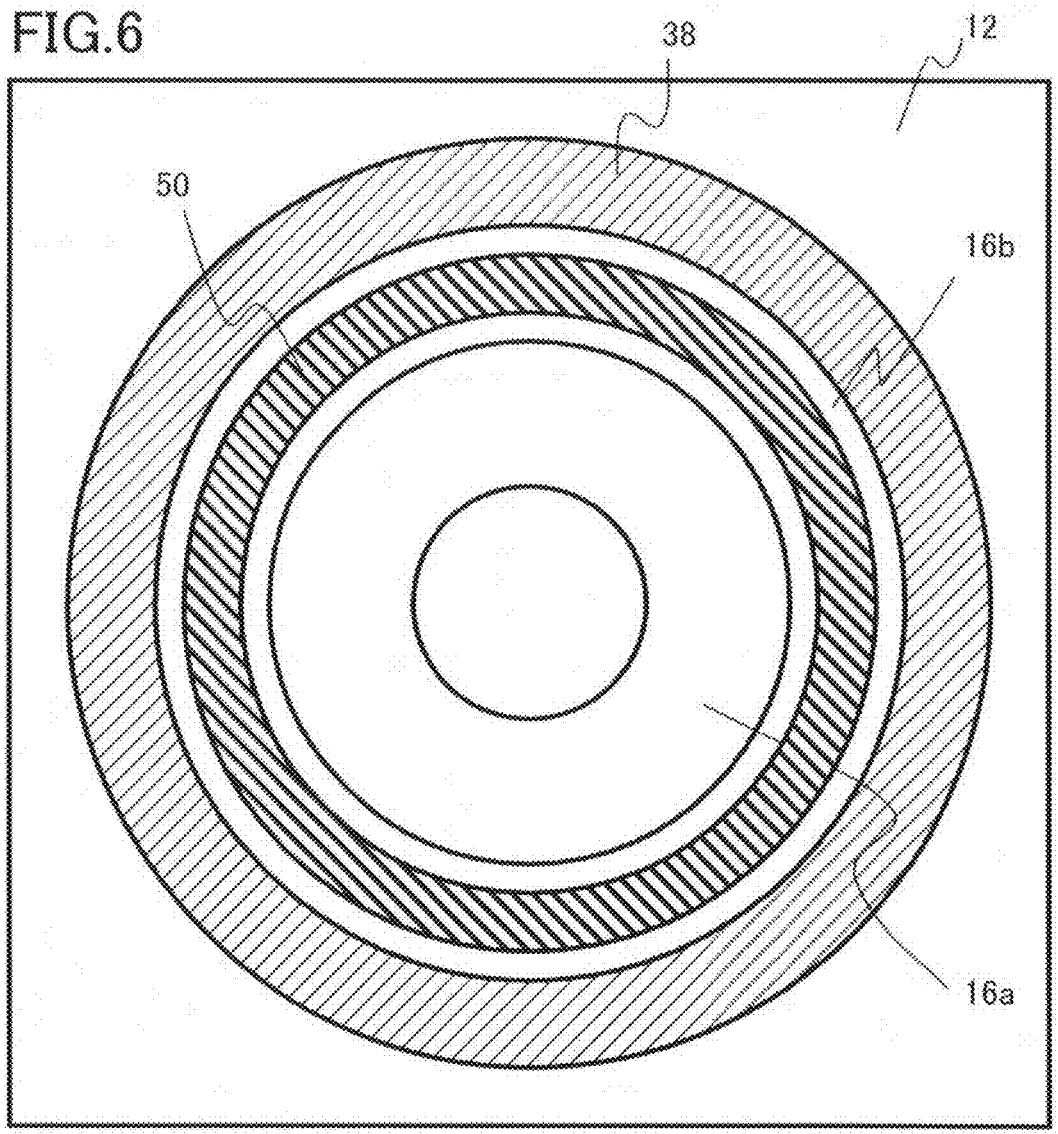

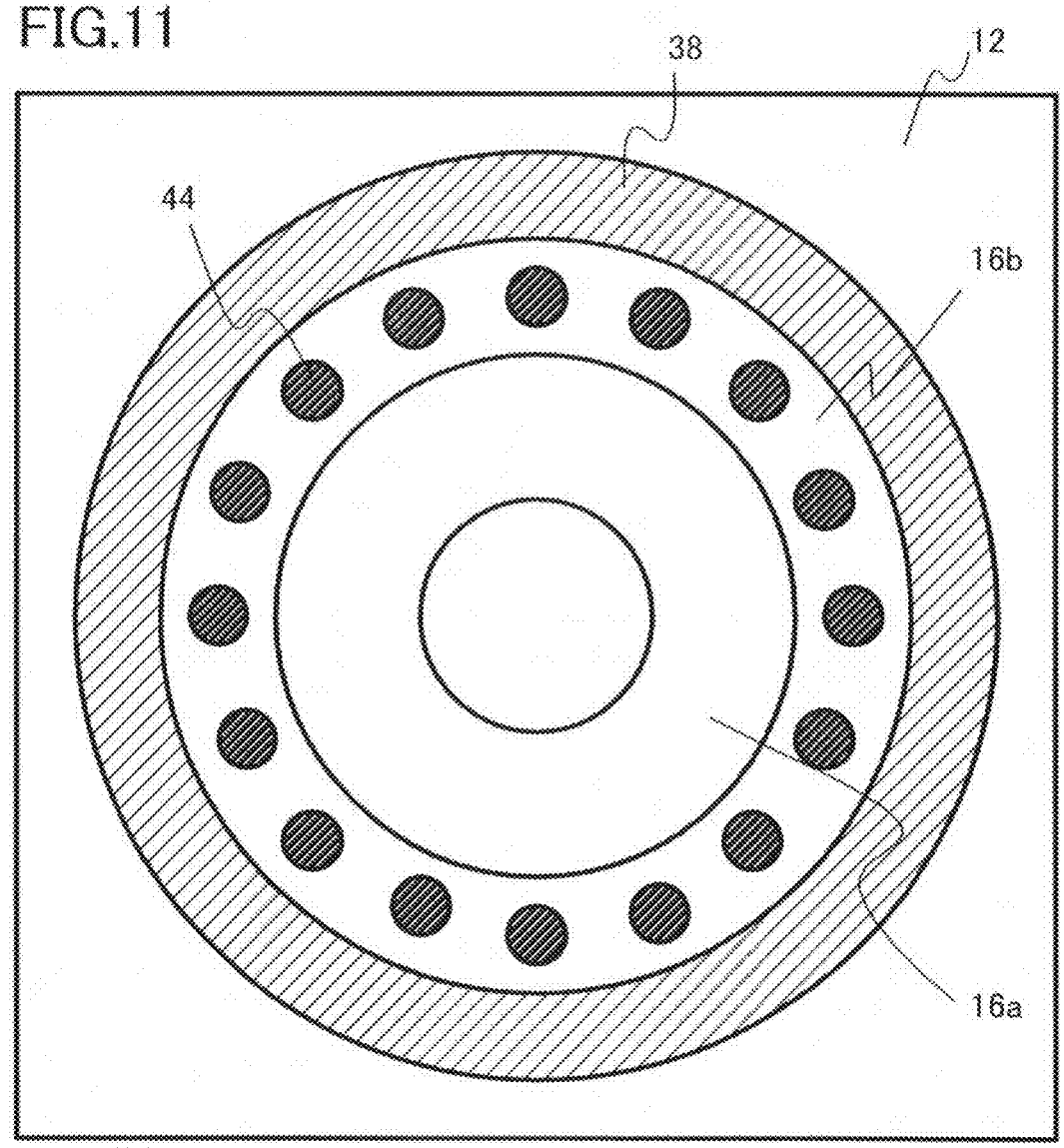

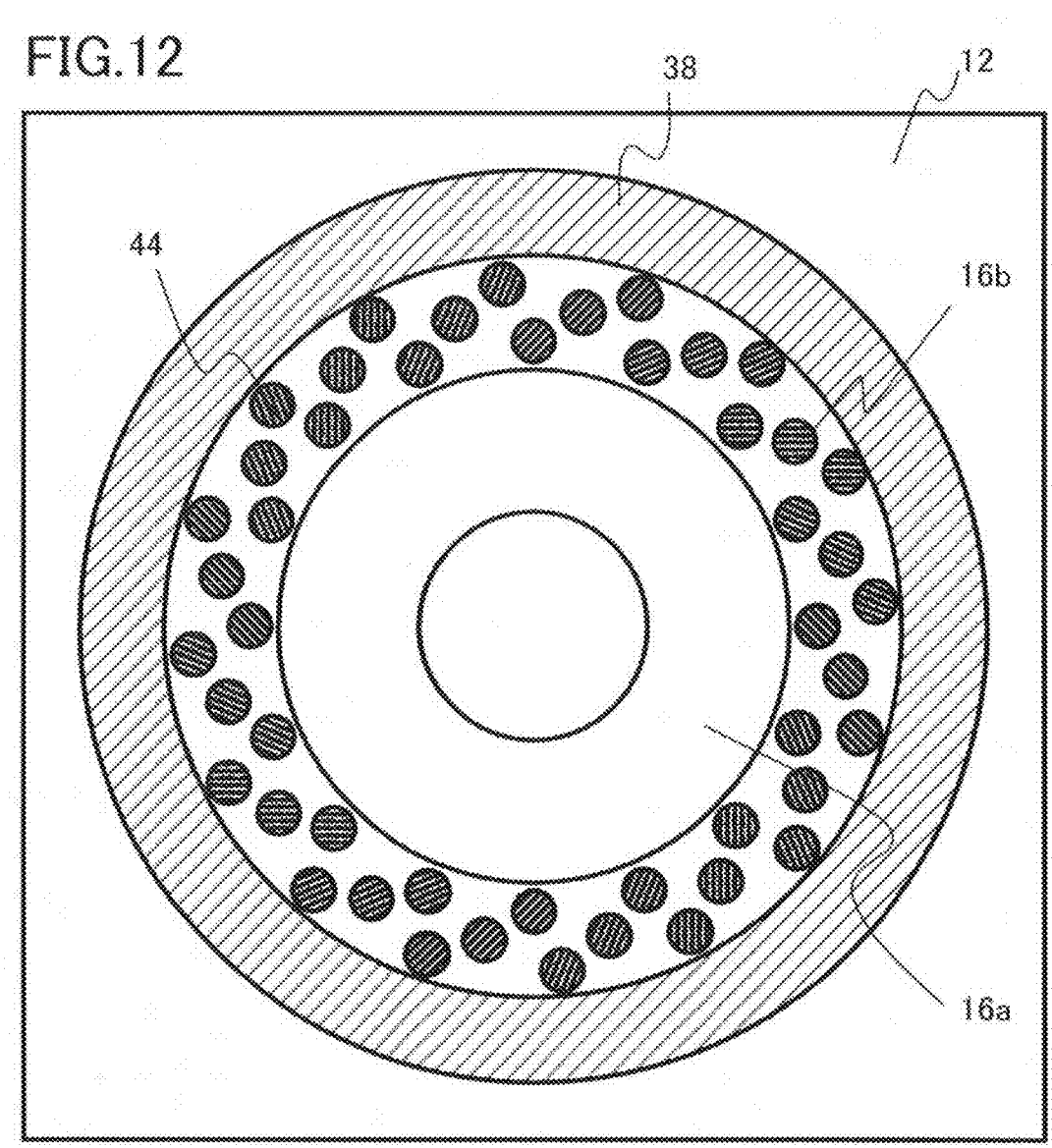

OPTICAL SEMICONDUCTOR DEVICE

CROSS-REFERENCE TO RELATED APPLICATION

This application is based upon and claims the benefit of priority from Japanese Patent Application No. 2012-288321, filed on Dec. 28, 2012, the entire contents of which are incorporated herein by reference.

FIELD

Embodiments described herein relate generally to optical semiconductor devices.

BACKGROUND

As LSI integration densities have been becoming higher in recent years, miniaturization of internal circuit patterns is progressing. Along with the miniaturization, interconnect cross-sectional areas become smaller, and accordingly, interconnect resistances become higher. Also, the distances between adjacent interconnects become shorter, and accordingly, the interconnect capacitance between interconnects increases.

As a result, the interconnect delay time determined from the interconnect resistance and the interconnect capacitance becomes longer, and it becomes difficult to realize higher-speed LSIs. Also, as more and more LSIs have multi-core structures and three-dimensional integration of memory is progressing, large-capacity transmission is now imperative between cores or between cores and memory, and the speed of transmission with electrical signals is the bottleneck in further improvement of LSIs.

An optical interconnect technique by which electrical signals are replaced with optical signals is now drawing attention as a technique for solving the interconnect delay problem accompanying higher-density LSIs. The optical interconnect technique is a method of transmitting signals by using an optical waveguide, instead of metal interconnects. The optical interconnect technique does not cause increases in interconnect resistance and capacitance between interconnects due to the above described miniaturization, and higher operation speeds can be expected with such a technique.

A semiconductor laser is used as a light emitting element that is used as a light source according to the optical interconnect technique. The semiconductor lasers used in conventional optical communications each have a size of several μm and a length of a hundred μm, which are much larger compared with LSI transistors and interconnect pitch. Therefore, the size of each semiconductor laser is a major hindrance to replacement of electrical interconnects with optical interconnects. In view of this, attention is now being drawn to microring (or microdisk) lasers each using a resonator having a microring (or a microdisk) as a small-sized light source.

Also, to realize optical interconnects on an LSI chip, an optical transmission/reception system needs to be formed by integrating a light receiving element (a light receiving unit), a drive circuit, and amplifier circuit, as well as a light emitting element (an emitting unit) as a light source and an optical waveguide (a transmitting unit), on the same chip in a compact fashion.

In a case where a microring laser as a light emitting element and a light receiving element are integrated, it is desirable to form the light receiving element and the light emitting element with the same microring structures, so as to lower costs. By doing so, the light emitting element and the light receiving element can be simultaneously manufactured through the same process.

In a light emitting element and a light receiving element having a microring structure, a positive electrode and a negative electrode are provided above and below an active layer so that light emission and light reception can be performed by applying a bias voltage to the element. Examples of electrode structures include a structure having the lower electrode (normally the negative electrode) provided inside the microring (an internal electrode structure) and a structure having the lower electrode outside the microring (an external electrode structure).

Between those two, an internal electrode structure is effective with a relatively large ring (several tens of μm or larger). On the other hand, an external electrode structure is effective with a ring or a disk in which it is difficult or impossible to form an electrode, such as a ring of 10 um or smaller in diameter or a disk.

Particularly, miniaturization of microring structures is a critical issue not only in achieving higher integration but also in reducing power consumptions and increasing speeds of elements. Miniaturization of microring structures is also critical in wavelength division multiplexing (WDM) for achieving larger capacities.

For example, in a case where wavelength multiplexing is performed with a microring laser, oscillation wavelength can be easily varied by gradually changing the ring diameter. However, the variable wavelength range is normally one to two times larger than the free spectral range (FSR), so as to avoid crosstalk between wavelength channels. Therefore, the variable wavelength range becomes narrower as the ring becomes larger. The narrowing of the variable wavelength range leads to an increase in crosstalk, an increase in size of the multiplexing/demultiplexing device (the wavelength filter), and a reduction in the bandwidth.

As described above, an external electrode structure can be considered suitable for reductions in the size and power consumption of a light emitting element or a light receiving element having a microring structure, and for an increase in the capacity through WDM.

BRIEF DESCRIPTION OF THE DRAWINGS

FIG. 2 is a schematic view of the optical semiconductor device of the first embodiment;

FIG. 6 is a schematic view of the optical semiconductor device of the second embodiment;

FIG. 11 is a schematic view of the optical semiconductor device of the fourth embodiment;

FIG. 12 is a schematic view of an optical semiconductor device of a fifth embodiment.

DETAILED DESCRIPTION

An optical semiconductor device of an embodiment includes: a first semiconductor layer of a first conductivity type; an active layer that is provided on the first semiconductor layer and has a ring- or disk-like shape; a second semiconductor layer of a second conductivity type that is provided on the active layer and has a ring- or disk-like shape; a first electrode that is provided on the first semiconductor layer; and a second electrode that is provided on the second semiconductor layer, the first semiconductor layer including a first region having a ring- or disk-like shape and a second region that is provided around the outer circumference of the first region and has a smaller thickness than the first region, the first electrode being provided on the second region, a groove or holes being provided in a portion of the second region located between the first region and the first electrode.

The following is a description of optical semiconductor devices of embodiments, with reference to the accompanying drawings.

In this specification, a ring-like shape is not limited to a shape that has a circular outer circumference or a circular inner circumference, but is a concept that includes any shape forming a ring, such as an elliptical shape or a shape formed by combining a straight line and a curve. Also, in this specification, a disk-like shape is not limited to a shape that has a circular outer circumference or a circular inner circumference, but is a concept that includes an elliptical shape or a shape formed by combining a straight line and a curved line.

(First Embodiment)

An optical semiconductor device of this embodiment includes: a first semiconductor layer of a first conductivity type; an active layer that is provided on the first semiconductor layer and has a ring- or disk-like shape; a second semiconductor layer of a second conductivity type that is provided on the active layer and has a ring- or disk-like shape; a first electrode that is provided on the first semiconductor layer; and a second electrode that is provided on the second semiconductor layer. The first semiconductor layer includes a first region having a ring- or disk-like shape, and a second region that is provided around the outer circumference of the first region and has a smaller thickness than the first region. The first electrode is provided on the second region, and grooves are provided in a portion of the second region located between the first region and the first electrode.

Having the above described structure, the optical semiconductor device of this embodiment reduces leakage of light circling around in the ring-like region through the second region. Accordingly, light loss can be reduced.

Figure 1A:
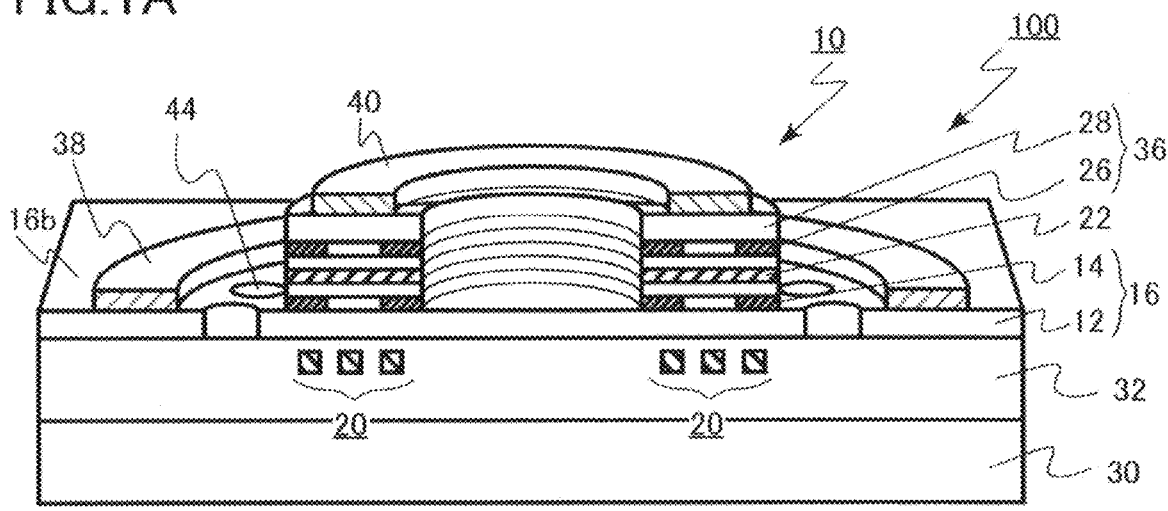
FIGS. 1A and 1B are schematic views of an optical semiconductor device of a first embodiment.
Figure 1B:
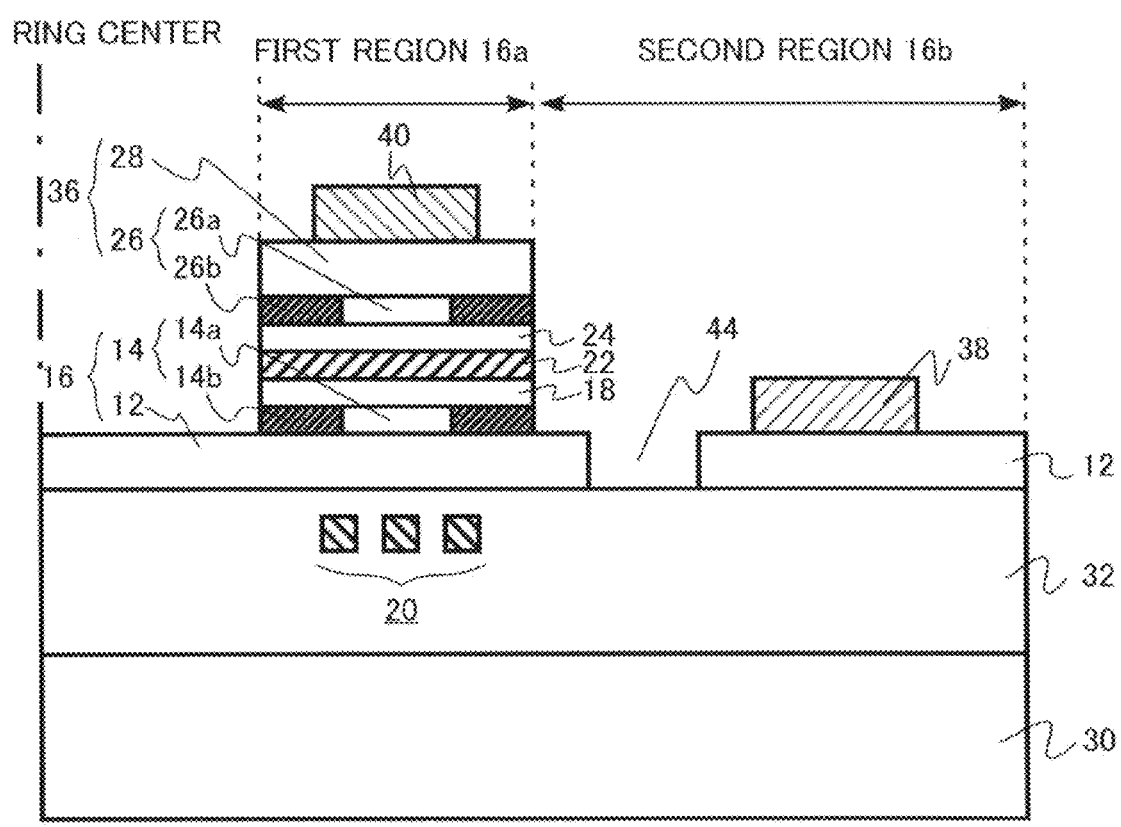

FIGS. 1A and 1B, and FIG. 2 are schematic views of the optical semiconductor device of this embodiment. FIG. 1A is a perspective cross-sectional view, and FIG. 1B is an enlarged cross-sectional view. FIG. 2 is a top view.

The optical semiconductor device of this embodiment is a light receiving element that converts an optical signal transmitted through an optical waveguide into an electrical signal. The light receiving element 100 has a microring structure.

The light receiving element 100 of the embodiment includes a light receiving unit 10 formed with stacked semiconductor layers, and an optical waveguide 20 optically linked to the light receiving unit 10. The optical waveguide 20 is formed in an insulating layer 32 provided on a semiconductor substrate 30, for example. The light receiving unit 10 is provided above the optical waveguide 20 via the insulating layer 32. The insulating layer 32 has a lower refractive index than the optical waveguide 20.

The semiconductor substrate 30 is made of silicon, for example. The optical waveguide 20 is made of single-crystal silicon or amorphous silicon, for example. The insulating layer 32 is a silicon oxide film, for example.

The optical waveguide 20 transmits an optical signal from a light emitting element (not shown) to the light receiving element 100. In FIG. 1, the optical waveguide 20 extends in a direction perpendicular to the drawing sheet surface. The width of the optical waveguide 20 is about 0.3 to 2 μm, for example, and the height is about 0.2 to 2 μm, for example.

Figure 3:
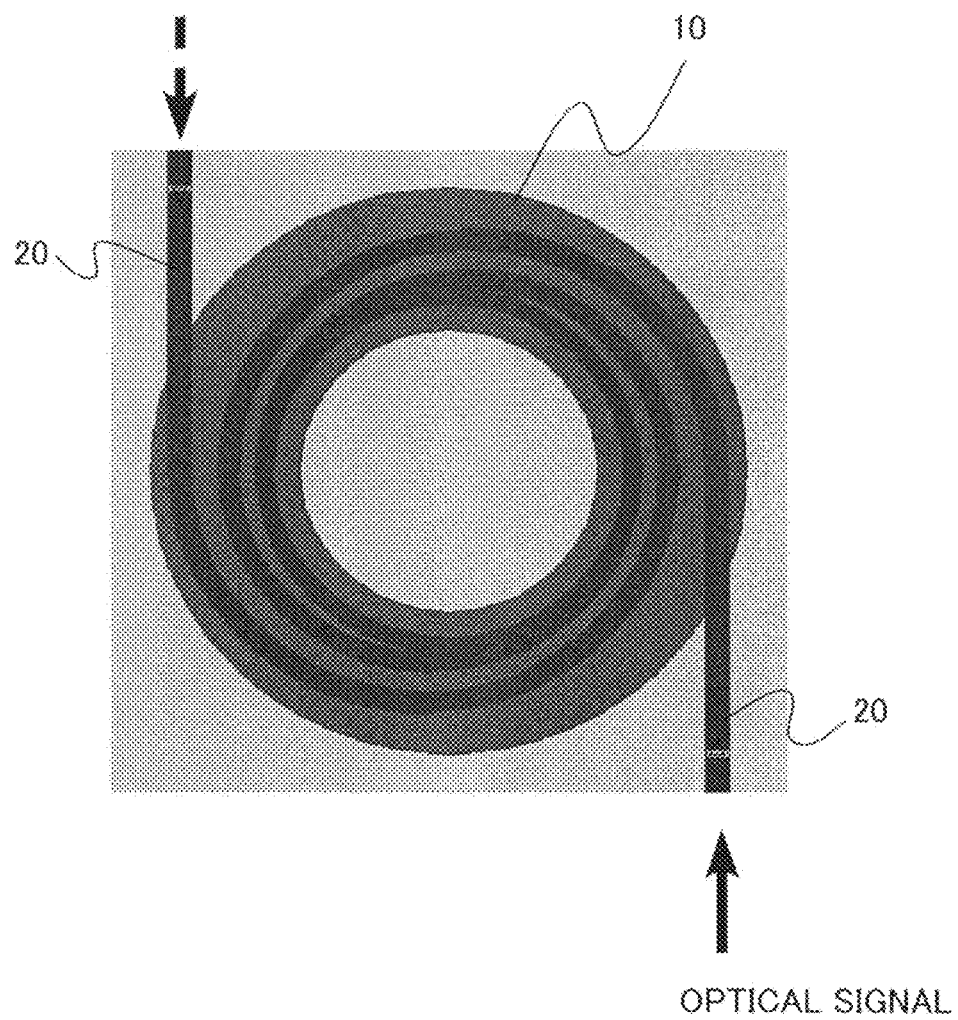
FIG. 3 is a schematic view showing the shape of an optical waveguide of the first embodiment.

FIG. 3 is a schematic view showing the shape of the optical waveguide. As shown in FIG. 3, the optical waveguide 20 has a helical shape that circles around below the light receiving unit 10. As the optical waveguide 20 circles around in a helical shape, effective light absorption length can be increased, and the absorption efficiency of the light receiving element 100 can be increased. Therefore, the optical waveguide 20 preferably has a helical shape.

The shape of the optical waveguide 20 may not be a helical shape, but may be a linear shape. However, so as to reduce loss due to light scattering in the ring-like region of the light receiving element 100, it is preferable to provide a curved waveguide that has a curvature radius that is equal to or larger than the curvature radius of the ring diameter. This is because the consistency between input light and the circling mode of light within the ring will be increased.

The semiconductor layers in the multilayer structure forming the light receiving unit 10 are made of a compound semiconductor, and may be made of a gallium arsenide (GaAs) compound semiconductor, for example.

The light receiving unit 10 includes: an n-type semiconductor layer (the first semiconductor layer) 16 formed with an n-type contact layer 12 and an n-type cladding layer 14; and a p-type semiconductor layer (the second semiconductor layer) 36 formed with a first light guide layer 18 formed on the n-type semiconductor layer (the first semiconductor layer) 16, an active layer 22 on the first light guide layer 18, a second light guide layer 24 on the active layer 22, a p-type cladding layer 26 on the second light guide layer 24, and a p-type contact layer 28 on the p-type cladding layer 26.

The n-type semiconductor layer (the first semiconductor layer) 16 formed with the n-type contact layer 12 and the n-type cladding layer 14 includes a first region 16a that has a ring-like shape, and a second region 16b that is formed around the outer circumference of the first region 16a and has a smaller thickness than the first region 16a. The second region 16b is also called a slab layer.

In FIG. 1, the upper surface of the slab layer (the second region 16b) matches the boundary between the n-type contact layer 12 and the n-type cladding layer 14, but the upper surface of the slab layer (the second region 16b) may be located in a lower position than the boundary between the n-type contact layer 12 and the n-type cladding layer 14.

The n-type semiconductor layer (the first semiconductor layer) 16 is optically-coupled to the optical waveguide 20.

The n-type contact layer 12 is a layer for forming an n-side electrode (the first electrode) 38 thereon. The n-type contact layer 12 has a higher impurity density than the n-type cladding layer 14. In this embodiment, the n-side electrode (the first electrode) 38 is formed on the n-type contact layer 12 of the second region 16b.

So as to facilitate the contact formation, the thickness of the second region 16b is preferably 100 nm or greater, or, more preferably, 150 nm or greater. So as to reduce leakage of light toward the outside of the ring, the thickness is preferably 500 nm or smaller, or, more preferably, 300 nm or smaller.

The n-type cladding layer 14 has a structure in which an n-type semiconductor layer 14a at the center portion is interposed between oxide layers 14b having a lower refractive index than the semiconductor layer 14a. With this structure, the current path is narrowed, and an effect to increase photoelectric conversion efficiency is achieved.

The first light guide layer 18 has a ring-like shape. The first light guide layer 18 is made of a semiconductor. The first light guide layer 18 has a higher refractive index than the n-type cladding layer 14.

The active layer 22 has a ring-like shape. In the active layer 22, electron-hole pairs are generated by the energy of received optical signals. The light receiving element 100 senses the generated electron-hole pairs as electrical signals. The active layer 22 has a multiquantum well structure, for example.

The second light guide layer 24 has a ring-like shape. The second light guide layer 24 is made of a semiconductor. The second light guide layer 24 has a higher refractive index than the p-type cladding layer 26.

The first and second light guide layers 18 and 24 have a function to trap light that has entered the active layer 22 therein.

The p-type cladding layer 26 has a ring-like shape. The p-type cladding layer 26 has a structure in which a p-type semiconductor layer 26a at the center portion is interposed between oxide layers 26b having a lower refractive index than the semiconductor layer 26a. With this structure, the current path is narrowed, and an effect to increase photoelectric conversion efficiency is achieved.

The p-type contact layer 28 has a ring-like shape. The p-type contact layer 28 has a higher impurity density than the p-type cladding layer 26. A second electrode 40 having a ring-like shape is formed on the p-type contact layer 28.

A voltage for sensing a current value represented by an electrical signal photoelectrically converted from an optical signal in the active layer 22 is applied between the first electrode 38 and the second electrode 40.

Round holes 44 are formed in a portion of the second region 16b located between the first region 16a of the n-type semiconductor layer 16 and the first electrode 38. The holes 44 are arranged at regular intervals along the outer circumference of the first region 16a, as shown in FIG. 2. The holes 44 preferably penetrate through the n-type contact layer 12 of the second region 16b, so as to facilitate the manufacture.

The n-type semiconductor layer 16 is an n-type aluminum gallium arsenide (AlGaAs) layer of about 50 to 2000 nm in thickness, for example. In the n-type cladding layer 14, the semiconductor layer 14a is made of n-type aluminum gallium arsenide (AlGaAs), and the oxide layers 14b are made of an oxide of aluminum gallium arsenide, for example.

The first light guide layer 18 is a gallium arsenide (GaAs) layer, for example.

The active layer 22 is formed with an undoped multiple quantum well, for example. The active layer 22 has a structure in which three of indium gallium arsenide (InGaAs) quantum well layers of about 6 nm in thickness and gallium arsenide (GaAs) barrier layers of about 10 nm in thickness are alternately stacked, and the stack is vertically interposed between aluminum gallium arsenide layers each having a thickness of about 40 nm and a composition $Al_{0.1}Ga_{0.9}As$, for example.

The second light guide layer 24 is a gallium arsenide (GaAs) layer, for example.

The p-type semiconductor layer 36 is a p-type aluminum gallium arsenide (AlGaAs) layer of about 50 to 2000 nm in thickness, for example. In the p-type cladding layer 26, the semiconductor layer 26a is made of p-type aluminum gallium arsenide (AlGaAs), and the oxide layer 26b is made of an oxide of aluminum gallium arsenide, for example.

The first electrode 38 is made of a metal such as an AuZn alloy. The first electrode 38 is an anode electrode (a negative electrode). The second electrode 40 is made of a metal such as an AuGe alloy. The second electrode 40 is a cathode electrode (a positive electrode).

As the holes 44 are formed in the n-type contact layer 12 of the second region 16b in the light receiving element 100 of this embodiment, the effective refractive index of the second region 16b becomes lower. Accordingly, the effect to trap light in the ring-like first region 16a becomes greater. As a result, leakage of light that enters the optical waveguide 20 and circles around in the ring-like region of the light receiving unit 10 becomes smaller, and internal light loss is reduced. Thus, a light receiving element having a high photoelectric conversion efficiency can be realized.

Also, as the second region 16b minus the holes 44 remains, electrical continuity between the first electrode 38 and the first region 16a can be maintained.

To reduce internal light loss while maintaining electrical continuity, the area occupied by the holes 44 is preferably 20 to 80%, or more preferably, 30 to 70% of the area of the second region 16b located between the first region 16a and the first electrode 38.

Figure 4A:
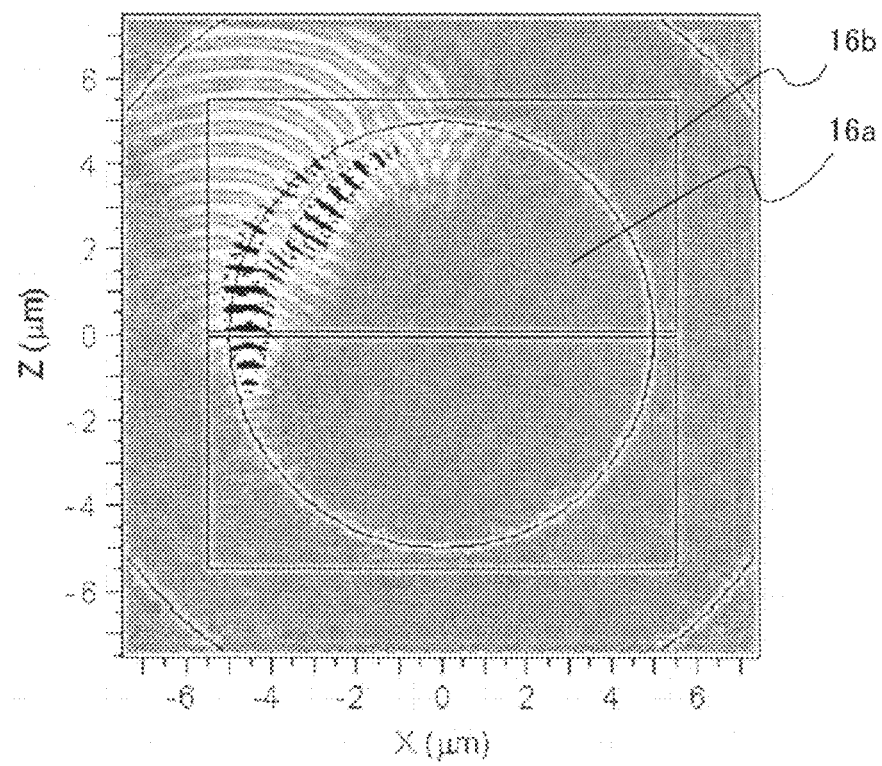
FIGS. 4A and 4B are diagrams illustrating the effects of the first embodiment.
Figure 4B:
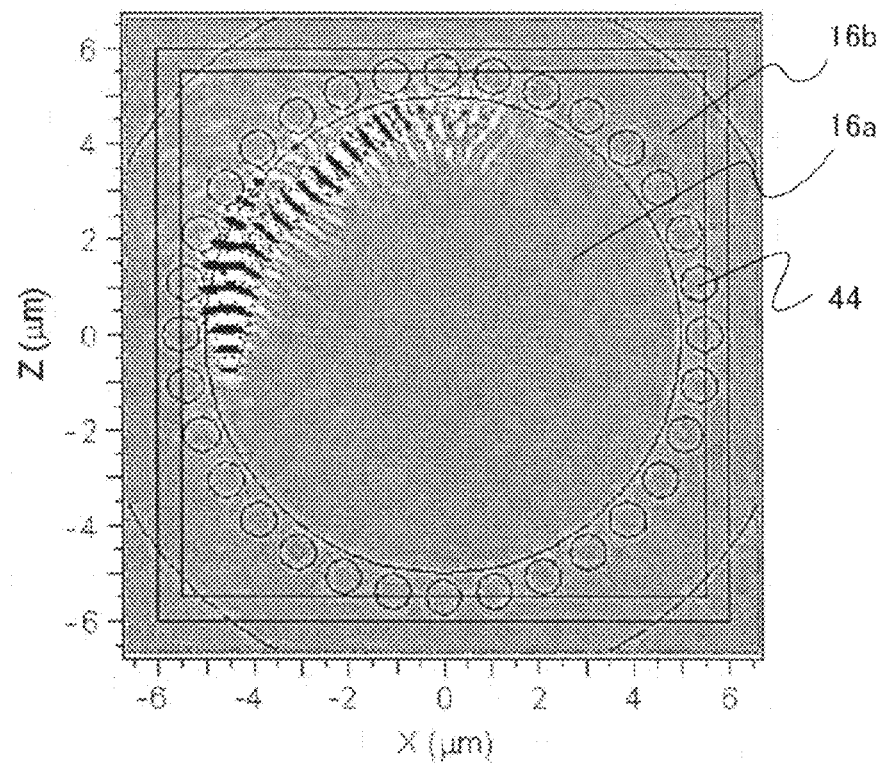

FIGS. 4A and 4B are diagrams illustrating the effects of this embodiment. FIG. 4A illustrates a case where no holes are formed in the slab layer (the second region), and FIG. 4B illustrates a case where holes are formed in the slab layer. The drawings show the results of simulations performed to observe light propagation in the rings of light receiving elements and leakage of light to the outside of the rings. In the drawings, light intensity distributions are shown. The simulations were performed by using the FDTD ((Finite Difference Time Domain) method.

In the simulations, the ring diameter was 10 μm, the slab layer thickness was 100 nm, the hole diameter was 800 nm, the hole pitch was 1100 nm, and the wavelength of circling light was 1.2 μm.

As is apparent from FIGS. 4A and 4B, the holes 44 are formed in the second region (the slab layer) 16b, so that leakage of light from the first region 16a is reduced. The internal light loss is 30 $cm^{-1}$ in the case illustrated in FIG. 4A, and is 10 $cm^{-1}$ in the case illustrated in FIG. 4B. As described above, according to this embodiment, loss due to leakage of light to the outside can be reduced.

Next, a manufacturing method according to this embodiment is described.

First, an SOI (Silicon on Insulator) substrate is prepared. Patterning is then performed on a silicon layer on the SOI substrate, to form the optical waveguide 20. A silicon oxide film fills the spaces between the circles of the optical waveguide 20.

A multilayer structure made of a compound semiconductor such as a gallium arsenide (GaAs) semiconductor is then formed.

In doing so, the n-type semiconductor layer 16 made of n-type aluminum gallium arsenide (AlGaAs), for example, is first epitaxially grown on a gallium arsenide (GaAs) substrate by MOVCD (Metal Organic Chemical Vapor Deposition) or MBE (Molecular Beam Epitaxy), for example. The n-type contact layer 12 is first formed as the n-type semiconductor layer 16, and the n-type cladding layer 14 having a lower impurity density than the n-type contact layer 12 is then formed.

The first light guide layer 18 made of gallium arsenide (GaAs), for example, is next grown on the n-type semiconductor layer 16 by epitaxial growth. The structure in which three of indium gallium arsenide (InGaAs) quantum well layers and gallium arsenide (GaAs) barrier layers are alternately stacked, and the stack is vertically interposed between aluminum gallium arsenide layers, for example, is formed as the active layer 22 on the first light guide layer 18. The second light guide layer 24 made of gallium arsenide (GaAs) is then formed on the active layer 22 by epitaxial growth.

The p-type semiconductor layer 36 made of p-type aluminum gallium arsenide (AlGaAs), for example, is then epitaxially grown on the second light guide layer 24. As the p-type semiconductor layer 36, the p-type cladding layer 26 is first formed, and the p-type contact layer 28 having a higher impurity density than the p-type cladding layer 26 is then formed.

The substrate having the semiconductor multilayer structure formed thereon and the SOI substrate having the optical waveguide 20 formed thereon are bonded to each other. After that, patterning is formed to shape the semiconductor multilayer structure into a ring. At this point, at least part of the n-type contact layer 12 is made to remain as the slab layer in the outer circumferential region of the ring-like shape. The remaining n-type contact layer 12 serves as the second region 16b.

After the formation of the ring-like shape, the n-type cladding layer 14 and the p-type cladding layer 26 are selectively oxidized by thermal oxidation from the inner circumferential side and the outer circumferential side of the ring-like shape, and the oxide layers 14b are formed.

The rink-like semiconductor multilayer structure is then filled with an insulating material (not shown) such as a silicon oxide film. Patterning is then performed to form the holes 44 in the second region 16b. At this point, the holes 44 preferably penetrate through the second region 16b, so as to perform stable control on the shape of the holes.

Contact holes are then formed, a metal film is formed, and patterning is performed on the metal film, to form the first electrode 38 and the second electrode 40.

Through the above steps, the light receiving element 100 shown in FIG. 1 is formed.

As described above, this embodiment can provide a light receiving element that has a small-sized microring structure and reduces light loss due to an external electrode structure. Also, as a reduction in light wavelength can be easily achieved, a light receiving element that has excellent temperature characteristics can be provided.

(Second Embodiment)

An optical semiconductor device of this embodiment is the same as the first embodiment, except that a ring-like groove, instead of holes, are provided in a portion of the second region located between the first region and the first electrode. Therefore, the same explanations as those in the first embodiment will not be repeated.

Figure 5A:
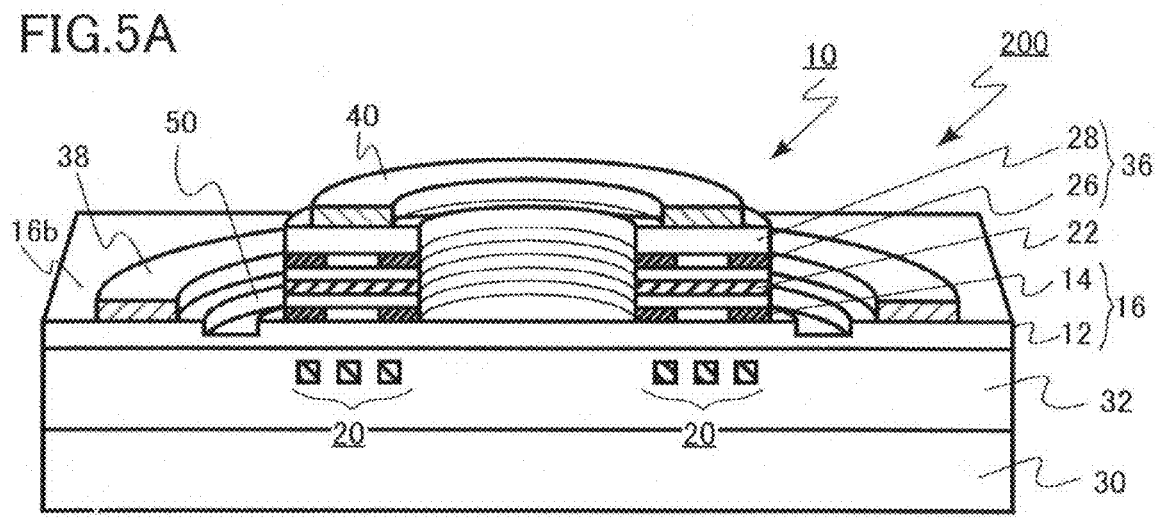
FIGS. 5A and 5B are schematic views of an optical semiconductor device of a second embodiment.
Figure 5B:
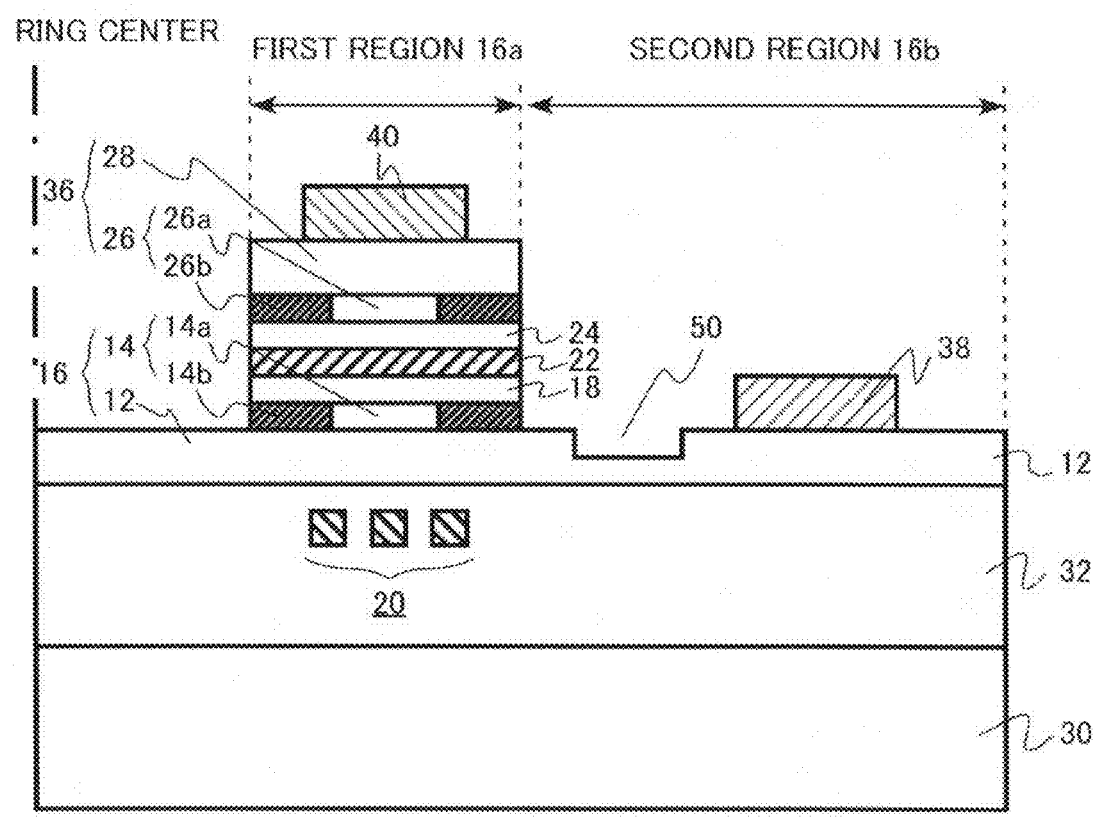

FIGS. 5A and 5B, and FIG. 6 are schematic views of the optical semiconductor device of this embodiment. FIG. 5A is a perspective cross-sectional view, and FIG. 5B is an enlarged cross-sectional view. FIG. 6 is a top view.

The optical semiconductor device of this embodiment is a light receiving element that converts an optical signal transmitted through an optical waveguide into an electrical signal. The light receiving element 200 has a microring structure.

A ring-like groove 50 is formed in the n-type contact layer 12 of the second region 16b located between the first region 16a of the n-type semiconductor layer 16 and the first electrode 38. So as to maintain electrical continuity between the first region 16a and the first electrode 38, the depth of the groove 50 is made smaller than the thickness of the second region 16b. That is, the groove 50 does not penetrate through the n-type contact layer 12 of the second region 16b.

Figure 7A:
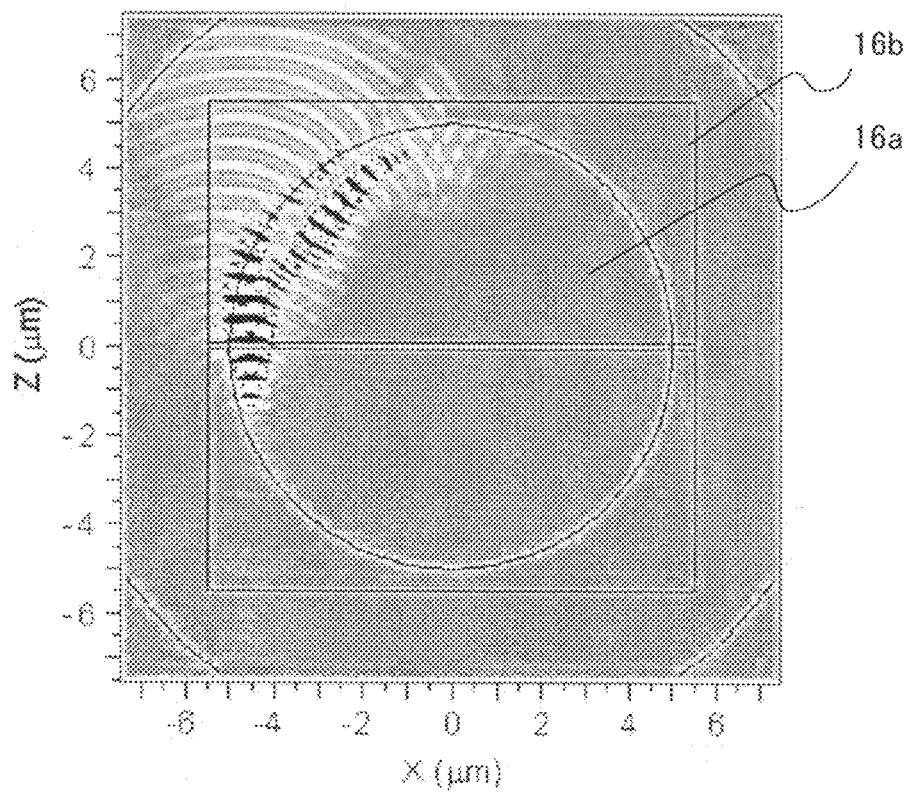
FIGS. 7A and 7B are diagrams illustrating the effects of the second embodiment.
Figure 7B:
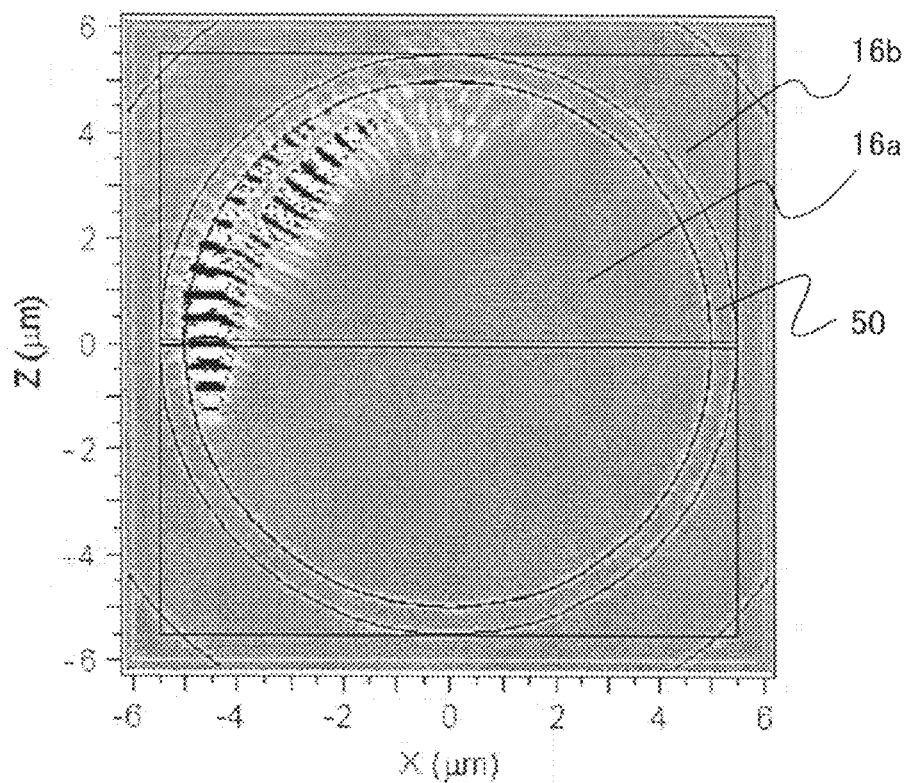

FIGS. 7A and 7B are diagrams illustrating the effects of this embodiment. FIG. 7A illustrates a case where the groove is not formed in the slab layer (the second region), and FIG. 7B illustrates a case where the groove is formed in the slab layer. The drawings show the results of simulations performed to observe light propagation in the rings of light receiving elements and leakage of light to the outside of the rings. In the drawings, light intensity distributions are shown. The simulations were performed by using the FDTD ((Finite Difference Time Domain) method.

In the simulations, the ring diameter was 10 μm, the slab layer thickness was 100 nm, the groove width was 500 nm, the groove depth was 50 nm, and the wavelength of circling light was 1.2 μm.

As is apparent from FIGS. 7A and 7B, the groove 50 is formed in the second region (the slab layer) 16b, so that leakage of light from the first region 16a is reduced. The internal light loss is 30 cm$^{-1}$ in the case illustrated in FIG. 7A, and is 4 cm$^{-1}$ in the case illustrated in FIG. 7B. As described above, according to this embodiment, loss due to leakage of light can be made almost one digit smaller.

As described above, this embodiment can provide a light receiving element that has a small-sized microring structure and reduces light loss due to an external electrode structure. Also, as a reduction in light wavelength can be easily achieved, a light receiving element that has excellent temperature characteristics can be provided.

(Third Embodiment)

An optical semiconductor device of this embodiment is the same as the first embodiment, except that holes and a ring-like groove are formed in a portion of the second region located between the first region and the first electrode. Therefore, the same explanations as those in the first embodiment will not be repeated.

Figure 8:
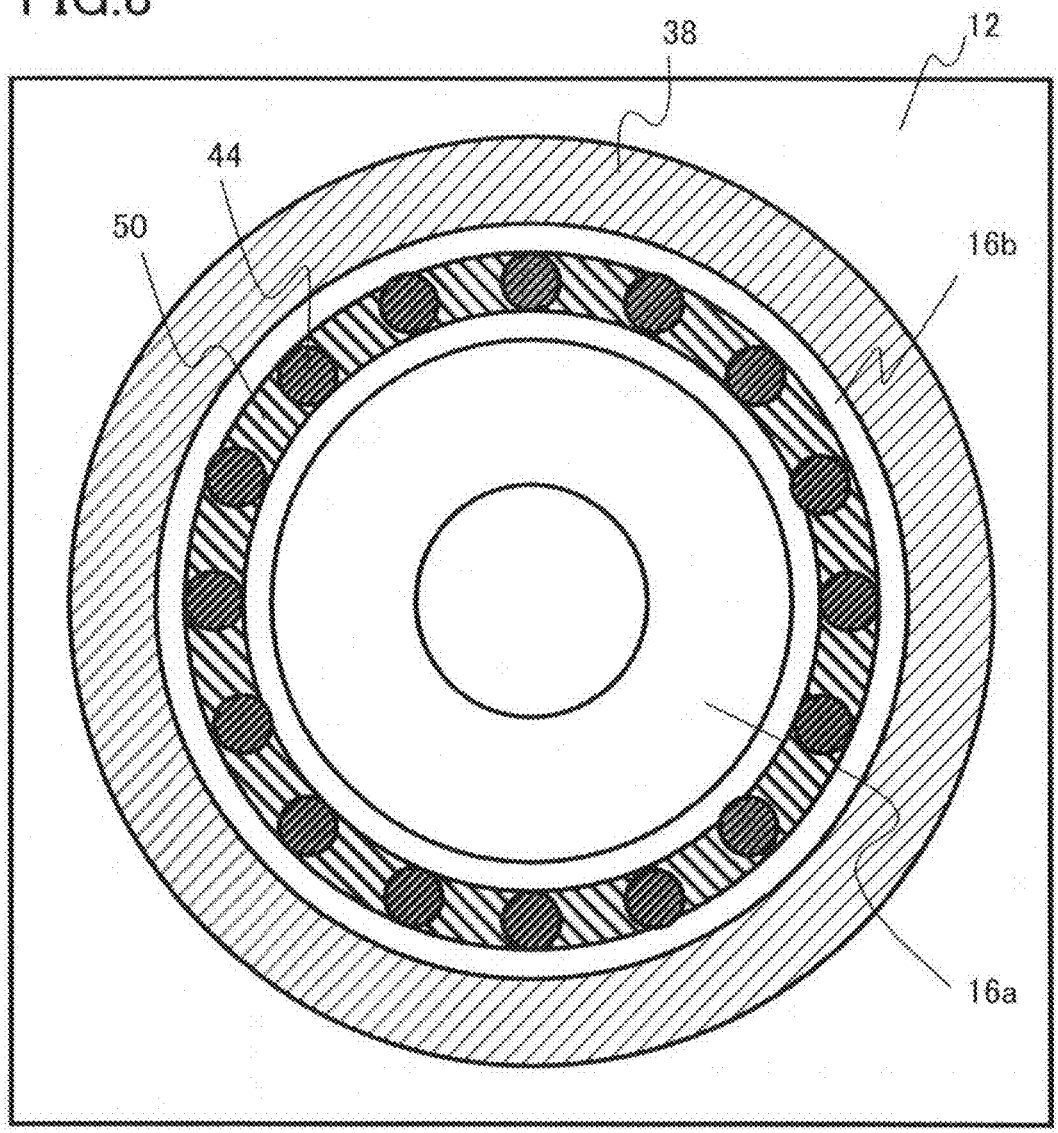
FIG. 8 is a schematic view of an optical semiconductor device of a third embodiment.

FIG. 8 is a schematic view of the optical semiconductor device of this embodiment. FIG. 8 is a top view.

The optical semiconductor device of this embodiment is a light receiving element that converts an optical signal transmitted through an optical waveguide into an electrical signal. The light receiving element has a microring structure.

Holes 44 and a ring-like groove 50 are formed in a portion of the second region 16b located between the first region 16a of the n-type semiconductor layer 16 and the first electrode 38. The holes 44 are arranged at regular intervals along the outer circumference of the first region 16a, as shown in FIG. 8. The holes 44 preferably penetrate through the second region 16b, so as to facilitate the manufacture.

Also, so as to maintain electrical continuity between the first region 16a and the first electrode 38, the depth of the groove 50 is made smaller than the thickness of the second region 16b. That is, the groove 50 does not penetrate through the second region 16b.

Figure 9A:
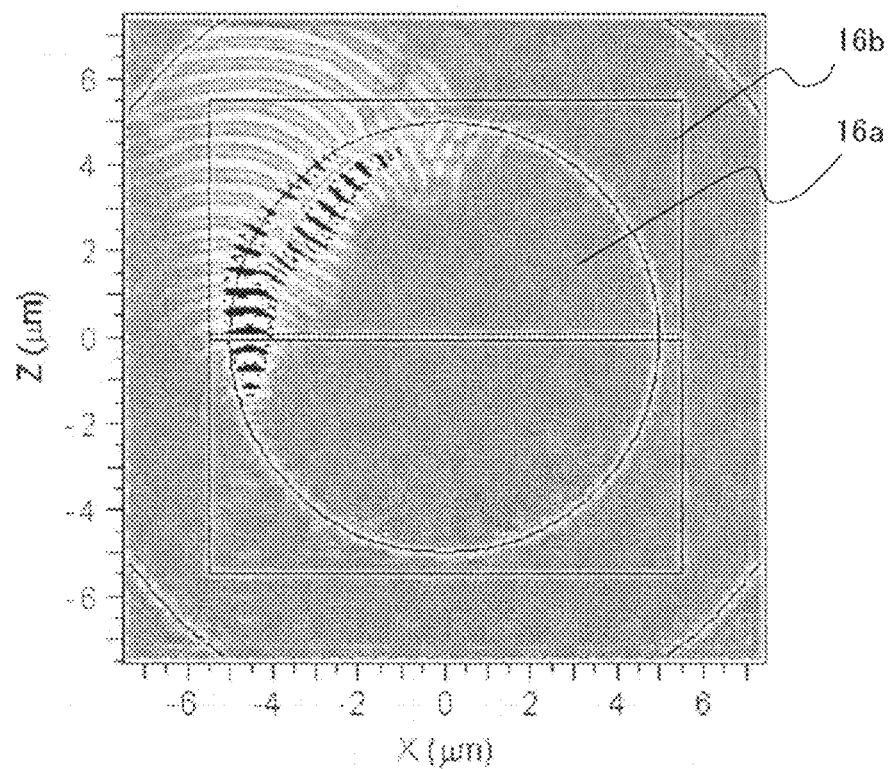
FIGS. 9A and 9B are diagrams illustrating the effects of the third embodiment.
Figure 9B:
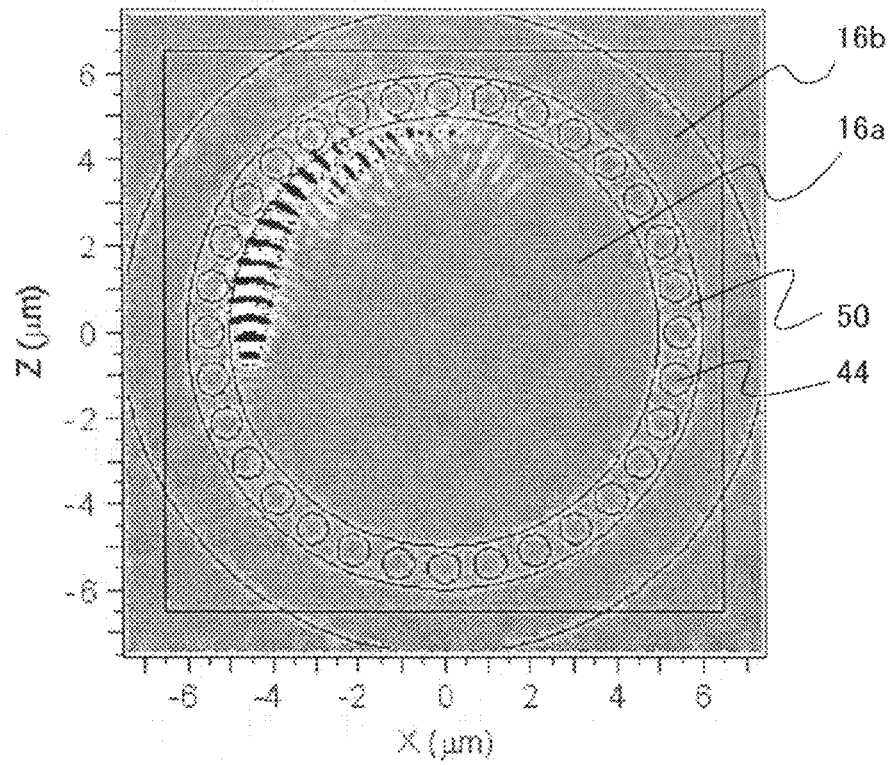

FIGS. 9A and 9B are diagrams illustrating the effects of this embodiment. FIG. 9A illustrates a case where the groove is not formed in the slab layer (the second region), and FIG. 9B illustrates a case where the groove is formed in the slab layer. The drawings show the results of simulations performed to observe light propagation in the rings of light receiving elements and leakage of light to the outside of the rings. In the drawings, light intensity distributions are shown.

The simulations were performed by using the FDTD ((Finite Difference Time Domain) method.

In the simulations, the ring diameter was 10 µm, the slab layer thickness was 100 nm, the groove width was 1 µm, the groove depth was 25 nm, the hole diameter was 750 nm, the hole pitch was 1100 nm, and the wavelength of circling light was 1.2 µm.

As is apparent from FIGS. 9A and 9B, the groove 50 and the holes 44 are formed in the second region (the slab layer) 16b, so that leakage of light from the first region 16a is reduced. The internal light loss is 30 $cm^{-1}$ in the case illustrated in FIG. 9A, and is 4 $cm^{-1}$ in the case illustrated in FIG. 9B. As described above, according to this embodiment, loss due to leakage of light can be made almost one digit smaller.

As described above, this embodiment can provide a light receiving element that has a small-sized microring structure and reduces light loss due to an external electrode structure. Also, as a reduction in light wavelength can be easily achieved, a light receiving element that has excellent temperature characteristics can be provided.

Furthermore, with the groove and the holes being combined, the structure for reducing internal light loss while maintaining electrical continuity can be easily optimized.

(Fourth Embodiment)

An optical semiconductor device of this embodiment differs from the first embodiment in being not a light receiving element but a light emitting element. Particularly, the semiconductor multilayer structure is the same as that of the first embodiment. Therefore, some of the explanations that are the same as those in the first embodiment will not be repeated.

Figure 10A:
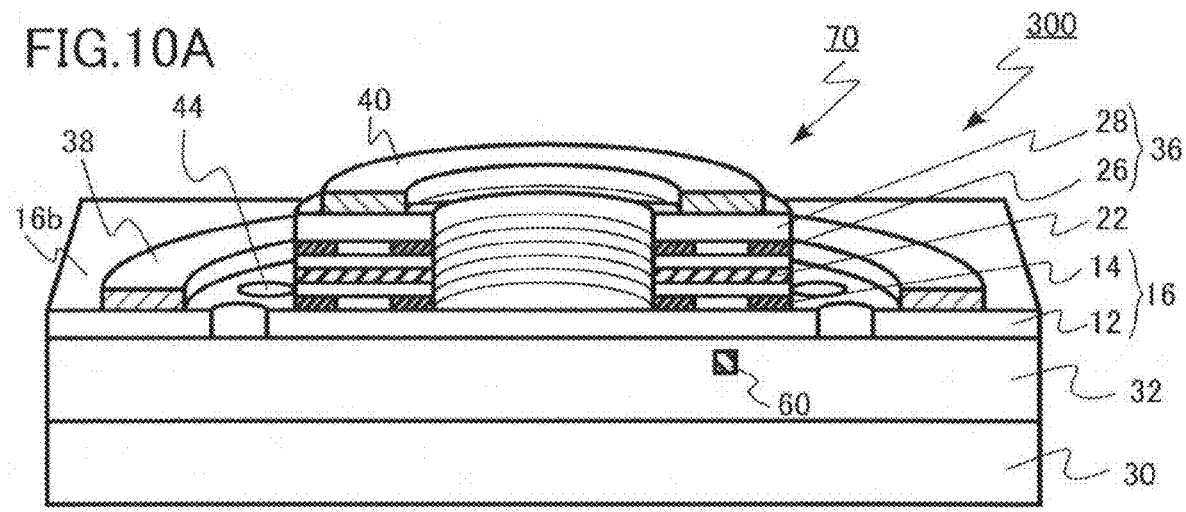
FIGS. 10A and 10B are schematic views of an optical semiconductor device of a fourth embodiment.
Figure 10B:
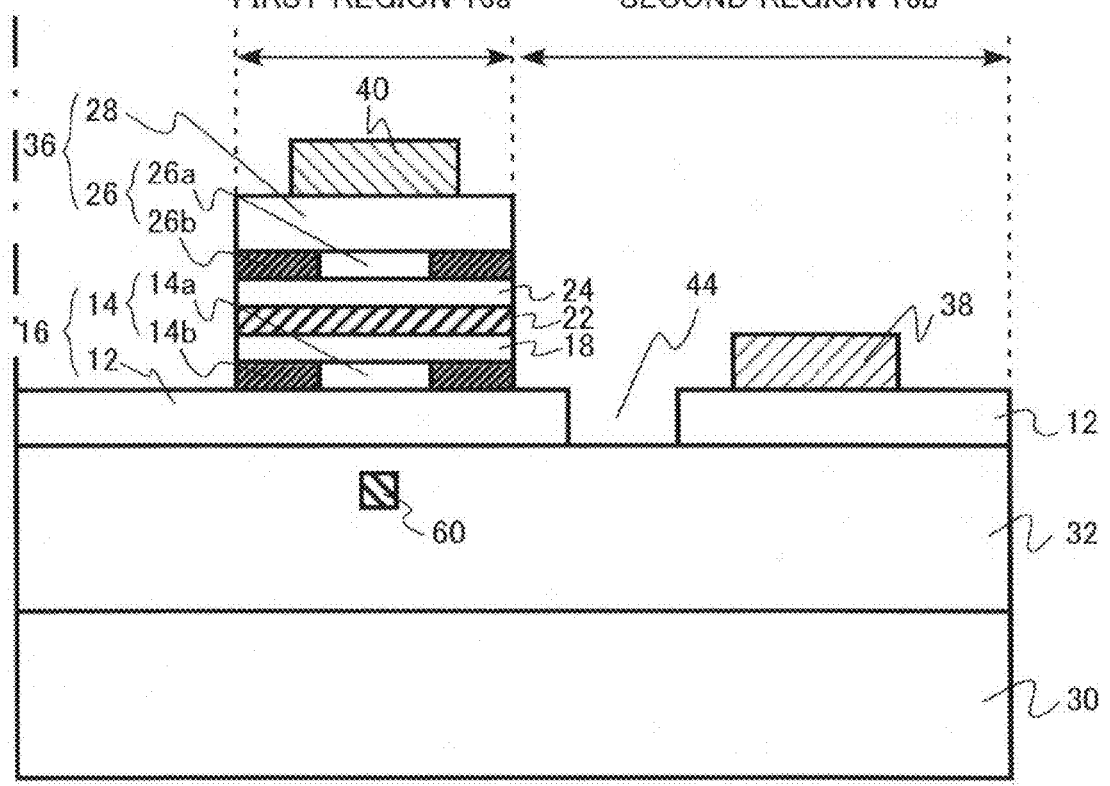

FIGS. 10A and 10B, and FIG. 11 are schematic views of the optical semiconductor device of this embodiment. FIG. 10A is a perspective cross-sectional view, and FIG. 10B is an enlarged cross-sectional view. FIG. 11 is a top view.

The optical semiconductor device of this embodiment is a light emitting element that converts an electrical signal applied between electrodes into an optical signal with an optical oscillator. The light emitting element 300 is a microring laser that has a microring structure.

The light emitting element 300 of this embodiment includes an optical resonator (a light emitting unit) 70 that is formed with stacked semiconductor layers, and an optical waveguide 60 that is optically coupled to the optical resonator 70. The optical waveguide 60 is formed in an insulating layer 32 provided on a semiconductor substrate 30, for example. The optical resonator 70 is provided above the optical waveguide 60 via the insulating layer 32. The insulating layer 32 has a lower refractive index than the optical waveguide 60.

The semiconductor substrate 30 is made of silicon, for example. The optical waveguide 60 is made of single-crystal silicon or amorphous silicon, for example. The insulating layer 32 is a silicon oxide film, for example.

The optical waveguide 60 transmits the optical signal generated by the optical resonator 70 to a light receiving element (not shown). In FIG. 10, the optical waveguide 60 extends in a direction perpendicular to the drawing sheet surface. The width of the optical waveguide 60 is about 0.3 to 2 µm, for example, and the height is about 0.2 to 2 µm, for example. The optical waveguide 60 has a linear shape, for example, or is a curved waveguide having a curvature radius that is equal to or greater than the curvature radius of the ring diameter of the optical resonator 70.

The semiconductor layers in the multilayer structure forming the optical resonator 70 are made of a compound semiconductor, and may be made of a gallium arsenide (GaAs) semiconductor, for example.

The optical resonator 70 includes: an n-type semiconductor layer (the first semiconductor layer) 16 formed with an n-type contact layer 12 and an n-type cladding layer 14; and a p-type semiconductor layer (the second semiconductor layer) 36 formed with a first light guide layer 18 formed on the n-type semiconductor layer (the first semiconductor layer) 16, an active layer 22 on the first light guide layer 18, a second light guide layer 24 on the active layer 22, a p-type cladding layer 26 on the second light guide layer 24, and a p-type contact layer 28 on the p-type cladding layer 26.

The n-type semiconductor layer (the first semiconductor layer) 16 formed with the n-type contact layer 12 and the n-type cladding layer 14 includes a first region 16a that has a ring-like shape, and a second region 16b that is formed around the outer circumference of the first region 16a and has a smaller thickness than the first region 16a. The second region 16b is also called a slab layer.

In FIG. 11, the upper surface of the slab layer (the second region 16b) matches the boundary between the n-type contact layer 12 and the n-type cladding layer 14, but the upper surface of the slab layer (the second region 16b) may be located in a lower position than the boundary between the n-type contact layer 12 and the n-type cladding layer 14.

The n-type semiconductor layer (the first semiconductor layer) 16 is optically-coupled to the optical waveguide 60.

The n-type contact layer 12 is a layer for forming an n-side electrode (the first electrode) 38 thereon. The n-type contact layer 12 has a higher impurity density than the n-type cladding layer 14. In this embodiment, the n-side electrode (the first electrode) 38 is formed on the n-type contact layer 12 of the second region 16b.

So as to facilitate the contact formation, the thickness of the second region 16b is preferably 100 nm or greater, or, more preferably, 150 nm or greater. So as to reduce leakage of light toward the outside of the ring, the thickness is preferably 500 nm or smaller, or, more preferably, 300 nm or smaller.

The n-type cladding layer 14 has a structure in which an n-type semiconductor layer 14a at the center portion is interposed between oxide layers 14b having a lower refractive index than the semiconductor layer 14a. With this structure, the current path is narrowed, and an effect to increase photoelectric conversion efficiency is achieved.

The first light guide layer 18 has a ring-like shape. The first light guide layer 18 is made of a semiconductor. The first light guide layer 18 has a higher refractive index than the n-type cladding layer 14.

The active layer 22 has a ring-like shape. In the active layer 22, an electrical signal to be applied between the first electrode 38 and a second electrode 40 is generated from light. The active layer 22 has a multiquantum well structure, for example.

The second light guide layer 24 has a ring-like shape. The second light guide layer 24 is made of a semiconductor. The second light guide layer 24 has a higher refractive index than the p-type cladding layer 26.

The first and second light guide layers 18 and 24 have a function to trap the light circling around in the active layer 22.

The p-type cladding layer 26 has a ring-like shape. The p-type cladding layer 26 has a structure in which a p-type semiconductor layer 26a at the center portion is interposed between oxide layers 26b having a lower refractive index than the semiconductor layer 26a. With this structure, the current path is narrowed, and an effect to increase photoelectric conversion efficiency is achieved.

The p-type contact layer 28 has a ring-like shape. The p-type contact layer 28 has a higher impurity density than the p-type cladding layer 26. A second electrode 40 having a ring-like shape is formed on the p-type contact layer 28.

A voltage for generating an optical signal is applied between the first electrode 38 and the second electrode 40.

When current flows between the first electrode 38 and the second electrode 40, carriers are injected into the active layer 22. Stimulated emission is then generated from recoupling of the injected carriers. The light emitted through the stimulated emission is repeatedly total-reflected by the interface on the outer wall side of the ring (the outer circumferential side), and circles around in the ring-like optical resonator 70, to cause laser oscillation.

The light obtained as a result of the laser oscillation is transmitted as a signal to the optical waveguide 60 that is optically coupled to the optical resonator 70.

Holes 44 are then formed in a portion of the second region 16b located between the first region 16a of the n-type semiconductor layer 16 and the first electrode 38. The holes 44 are arranged at regular intervals along the outer circumference of the first region 16a, as shown in FIG. 11. The holes 44 preferably penetrate through the second region 16b, so as to facilitate the manufacture.

As the holes 44 are formed in the second region 16b in the light emitting element 300 of this embodiment, the effective refractive index of the second region 16b becomes lower. Accordingly, the effect to trap light in the ring-like first region 16a becomes greater. As a result, leakage of light that is generated in the active layer 22 and circles around in the ring-like structure becomes smaller, and internal light loss is reduced. Thus, a light emitting element having a high photoelectric conversion efficiency can be realized.

As described above, this embodiment can provide a light emitting element that has a small-sized microring structure and reduces light loss due to an external electrode structure. Also, as a reduction in light wavelength can be easily achieved, a light emitting element that has excellent temperature characteristics can be provided.

(Fifth Embodiment)

An optical semiconductor device of this embodiment is the same as that of the fourth embodiment, except that holes are arranged in directions oblique to the outer circumference of the first region. Therefore, the same explanations as those in the fourth embodiment will not be repeated.

FIG. 12 is a schematic view of the optical semiconductor device of this embodiment. FIG. 12 is a top view.

As shown in FIG. 12, holes 44 are formed in a portion of the second region 16b located between the first region 16a of the n-type semiconductor layer 16 and the first electrode 38. The holes 44 are arranged in such a pattern that the holes 44 are aligned in directions oblique to the outer circumference of the first region 16a, as shown in FIG. 12. In other words, the holes 44 are arranged asymmetrically with respect to the diametrical direction of the ring-like shape.

The holes 44 preferably penetrate through the n-type contact layer 12 of the second region 16b, so as to facilitate the manufacture.

As the holes 44 are arranged in an asymmetrical manner, light loss can be made to vary with circling directions. This is because the effective refractive index of the second region 16b varies depending on circling directions. As a result, light can be selectively amplified and oscillated in only in one-direction circling mode. Accordingly, laser light can be stably emitted only in one direction while internal loss is reduced.

Figure 13A:
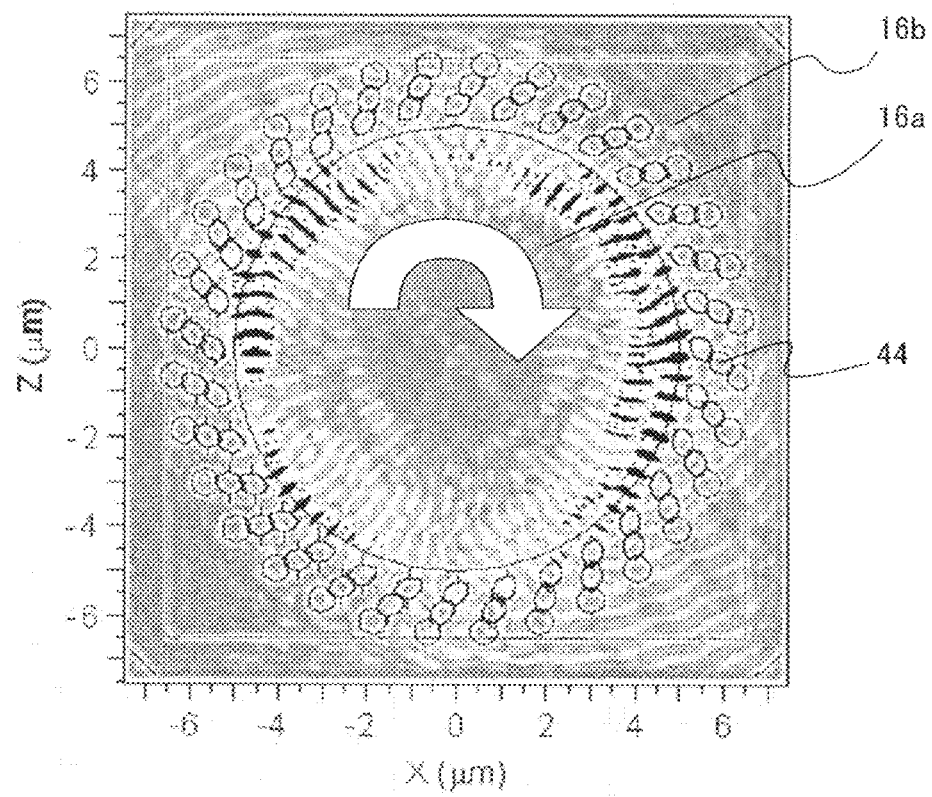
FIGS. 13A and 13B are diagrams illustrating the effects of the fifth embodiment.
Figure 13B:
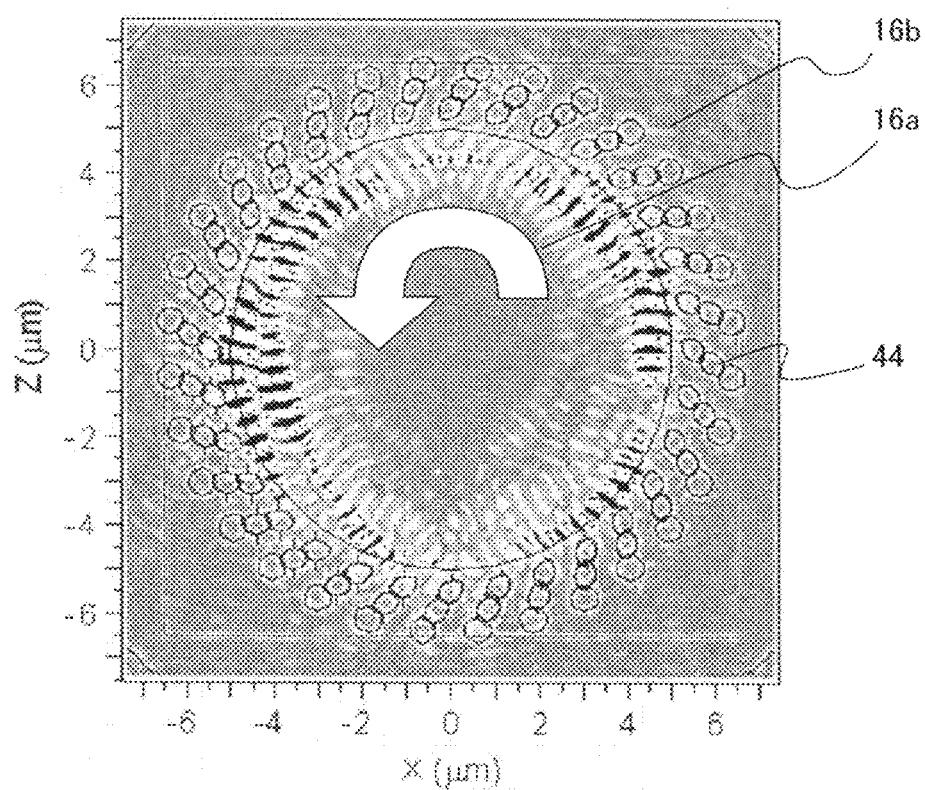

FIGS. 13A and 13B are diagrams illustrating the effects of this embodiment. FIG. 13A illustrates a case where light circles around clockwise, and FIG. 13B illustrates a case where light circles around counterclockwise. The drawings show the results of simulations performed to observe light propagation in the rings of light receiving elements and leakage of light to the outside of the rings. In the drawings, light intensity distributions are shown. The simulations were performed by using the FDTD ((Finite Difference Time Domain) method.

In the simulations, the ring diameter was 10 µm, the slab layer thickness was 100 nm, the hole diameter was 400 nm, and the wavelength of circling light was 1.2 µm. In the pattern, three holes are formed in each oblique direction.

As is apparent from FIGS. 13A and 13B, a large amount of light leaks from the first region 16a when light is circling around clockwise, but light leaking from the first region 16a is reduced when light is circling around counterclockwise. Accordingly, laser light can be stably emitted only in one direction while internal loss is reduced.

Embodiments have been described so far with reference to specific examples. The above described embodiments are merely examples, and do not limit the present disclosure. Although components of optical semiconductor devices that are not required in the description of the disclosure have not been described in the above embodiments, any necessary components related to optical semiconductor devices can be appropriately selected and used.

For example, optical semiconductor devices each having a ring-like multilayer structure have been described in the above embodiments. However, the present disclosure can also be applied to optical semiconductor devices each having a disk-like multilayer structure.

Also, each hole to be formed in the slab layer has a round shape. However, it is also possible to use an elliptical shape, a polygonal shape like a triangular shape or a rectangular shape, or any other shape, instead of a round shape.

Furthermore, the holes to be formed in the slab layer may not be formed at regular intervals or with regularity, but may be formed in a random manner.

Also, the same ring-like groove as that used in the light receiving elements may be formed in the second region in a light emitting element. Furthermore, asymmetrical holes may be formed in a light receiving element.

In the embodiments, an n-type semiconductor layer is formed in the lower portion of the multilayer structure, and a p-type semiconductor layer is formed in the upper portion, with an active layer being interposed in between. However, a p-type semiconductor layer may be formed in the lower portion, and an n-type semiconductor layer may be formed in the upper portion.

Although an optical waveguide is formed below the multilayer structure in each of the above embodiments, an optical waveguide may be formed above the multilayer structure.

While certain embodiments have been described, these embodiments have been presented by way of example only, and are not intended to limit the scope of the inventions. Indeed, the optical semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An optical semiconductor device comprising:
a first semiconductor layer of a first conductivity type;
an active layer provided on the first semiconductor layer, the active layer having a ring- or disk-like shape;

a second semiconductor layer of a second conductivity type provided on the active layer, the second semiconductor layer having a ring- or disk-like shape;
a first electrode provided on the first semiconductor layer; and
a second electrode provided on the second semiconductor layer,
wherein the first semiconductor layer includes a first region having a ring- or disk-like shape and a second region provided around an outer circumference of the first region, the second region having a smaller thickness than the first region,
the first electrode is provided on the second region, and
a groove or a plurality of holes are provided in a portion of the second region, the portion being located between the first region and the first electrode.

2. The device according to claim 1, further includes an optical waveguide optically coupled to the first or second semiconductor layer.

3. The device according to claim 2, wherein the optical waveguide is made of single-crystal silicon or amorphous silicon.

4. The device according to claim 1, wherein the plurality of holes penetrate through the second region.

5. The device according to claim 1, wherein a depth of the groove is smaller than the thickness of the second region.

6. The device according to claim 2, wherein the optical waveguide has a helical shape.

7. The device according to claim 1, wherein the plurality of holes are aligned in directions oblique to the outer circumference of the first region.

8. The device according to claim 1, wherein the first semiconductor layer and the second semiconductor layer are made of a gallium arsenide semiconductor.

* * * * *